(12) United States Patent
Subbarao et al.

(10) Patent No.: US 11,676,679 B2
(45) Date of Patent: Jun. 13, 2023

(54) TWO-LAYER CODE WITH LOW PARITY COST FOR MEMORY SUB-SYSTEMS

(71) Applicant: Micron Technology, Inc., Boise, ID (US)

(72) Inventors: Sanjay Subbarao, Irvine, CA (US); James Fitzpatrick, Laguna Niguel, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/470,265

(22) Filed: Sep. 9, 2021

(65) Prior Publication Data

US 2021/0407612 A1    Dec. 30, 2021

Related U.S. Application Data

(63) Continuation of application No. 16/883,839, filed on May 26, 2020, now Pat. No. 11,164,652.
(Continued)

(51) Int. Cl.
*G11C 29/42*    (2006.01)
*G11C 29/44*    (2006.01)
(Continued)

(52) U.S. Cl.
CPC .......... *G11C 29/42* (2013.01); *G11C 11/5635* (2013.01); *G11C 11/5642* (2013.01);
(Continued)

(58) Field of Classification Search
CPC ............. H03M 13/13; H03M 13/1105; H03M 13/2915; H03M 13/1102; H03M 13/098;
(Continued)

(56) References Cited

U.S. PATENT DOCUMENTS 7,000,168 B2    2/2006 Kurtas et al.
8,291,285 B1    10/2012 Varnica et al.
(Continued)

FOREIGN PATENT DOCUMENTS

KR    10-1684157    12/2016

OTHER PUBLICATIONS

International Search Report and Written Opinion, PCT/US2020/037297, dated Sep. 21, 2020.
(Continued)

*Primary Examiner* — Shelly A Chase
(74) *Attorney, Agent, or Firm* — Greenberg Traurig

(57) ABSTRACT

A memory sub-system configured to encode data using an error correcting code and an erasure code for storing data into memory cells and to decode data retrieved from the memory cells. For example, the data units of a predetermined size are separately encoded using the error correcting code (e.g., a low-density parity-check (LDPC) code) to generate parity data of a first layer. Symbols within the data units are cross encoded using the erasure code. Parity symbols of a second layer are calculated according to the erasure code. A collection of parity symbols having a total size equal to the predetermined size can be further encoded using the error correcting code to generate parity data for the parity symbols.

20 Claims, 10 Drawing Sheets

Related U.S. Application Data

(60) Provisional application No. 62/864,876, filed on Jun. 21, 2019.

(51) Int. Cl.
  *G11C 11/56* (2006.01)
  *H03M 13/11* (2006.01)

(52) U.S. Cl.
  CPC ......... *G11C 29/44* (2013.01); *H03M 13/1105* (2013.01); *G11C 2211/561* (2013.01)

(58) Field of Classification Search
  CPC .... H03M 13/2906; G11C 29/42; G11C 29/44; G11C 11/5635; G11C 11/5642
  See application file for complete search history.

(56) References Cited

U.S. PATENT DOCUMENTS

| | | |
|---|---|---|
| 8,621,318 B1 | 12/2013 | Micheloni et al. |
| 8,645,789 B2 | 2/2014 | Sharon et al. |
| 8,650,463 B2 | 2/2014 | Lim et al. |
| 8,924,815 B2 | 12/2014 | Frayer et al. |
| 10,417,089 B2 | 9/2019 | Oboukhov et al. |
| 10,474,527 B1 | 11/2019 | Sun |
| 11,164,652 B2 | 11/2021 | Subbarao et al. |
| 11,296,729 B2 | 4/2022 | Kale et al. |
| 2006/0075321 A1 | 4/2006 | Vedantham et al. |
| 2008/0163023 A1 | 7/2008 | Hong et al. |
| 2013/0301371 A1 | 11/2013 | Chen |
| 2013/0305120 A1 | 11/2013 | Torii et al. |
| 2014/0208186 A1 | 7/2014 | Stek et al. |
| 2015/0043281 A1 | 2/2015 | Hemink et al. |
| 2017/0046221 A1 | 2/2017 | Bandic et al. |
| 2018/0032395 A1* | 2/2018 | Yang ................... H03M 13/13 |
| 2018/0219561 A1* | 8/2018 | Litsyn ............... H03M 13/2915 |
| 2018/0287639 A1 | 10/2018 | Murakami |
| 2019/0140784 A1 | 5/2019 | Xi et al. |
| 2020/0402605 A1 | 12/2020 | Subbarao et al. |
| 2022/0029641 A1 | 1/2022 | Kale et al. |
| 2022/0200630 A1 | 6/2022 | Kale et al. |

OTHER PUBLICATIONS

Liva, et al. "Pivoting algorithms for maximum likelihood decoding of LDPC codes over erasure channels." IEEE, 2009.

Savin, et al. "Binary linear time erasure decoding for non-binary LDPC codes." IEEE, 2009.

\* cited by examiner

| | | | | |
|---|---|---|---|---|
| S1_1 | S1_2 | ••• | S1_N | P1 |
| S2_1 | S2_2 | ••• | S2_N | P2 |
| S3_1 | S3_2 | ••• | S3_N | P3 |
| S4_1 | S4_2 | ••• | S4_N | P4 |

501

| | | | | |
|---|---|---|---|---|
| S5_1 | S5_2 | ••• | S5_N | P5 |
| S6_1 | S6_2 | ••• | S6_N | P6 |
| S7_1 | S7_2 | ••• | S7_N | P7 |
| S8_1 | S8_2 | ••• | S8_N | P8 |

503

| | | | | |
|---|---|---|---|---|
| S9_1 | S9_2 | ••• | S9_N | P9 |
| S10_1 | S10_2 | ••• | S10_N | P10 |
| S11_1 | S11_2 | ••• | S11_N | P11 |
| S12_1 | S12_2 | ••• | S12_N | P12 |

505

| | | | | |
|---|---|---|---|---|
| S13_1 | S13_2 | ••• | S13_N | P13 |
| S14_1 | S14_2 | ••• | S14_N | P14 |
| S15_1 | S15_2 | ••• | S15_N | P15 |
| PS_1 | PS_2 | ••• | PS_N | PPS |

TWO-LAYER CODE WITH LOW PARITY COST FOR MEMORY SUB-SYSTEMS

RELATED APPLICATIONS

The present application is a continuation application of U.S. patent application Ser. No. 16/883,839 filed May 26, 2020 and issued as U.S. patent application Ser. No. 11,164, 652 on Nov 2, 2021, which claims priority to Prov. U.S. Pat. App. Ser. No. 62/864,876 filed Jun. 21, 2019, the entire disclosures of which applications are hereby incorporated herein by reference.

TECHNICAL FIELD

At least some embodiments disclosed herein relate to memory systems in general, and more particularly, but not limited to a two-layer code for storing data in and retrieve data from memory sub-systems.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The embodiments are illustrated by way of example and not limitation in the figures of the accompanying drawings in which like references indicate similar elements.

FIG. 7 illustrates an arrangement of a two-layer code across multiple planes.

DETAILED DESCRIPTION

Figure 1:
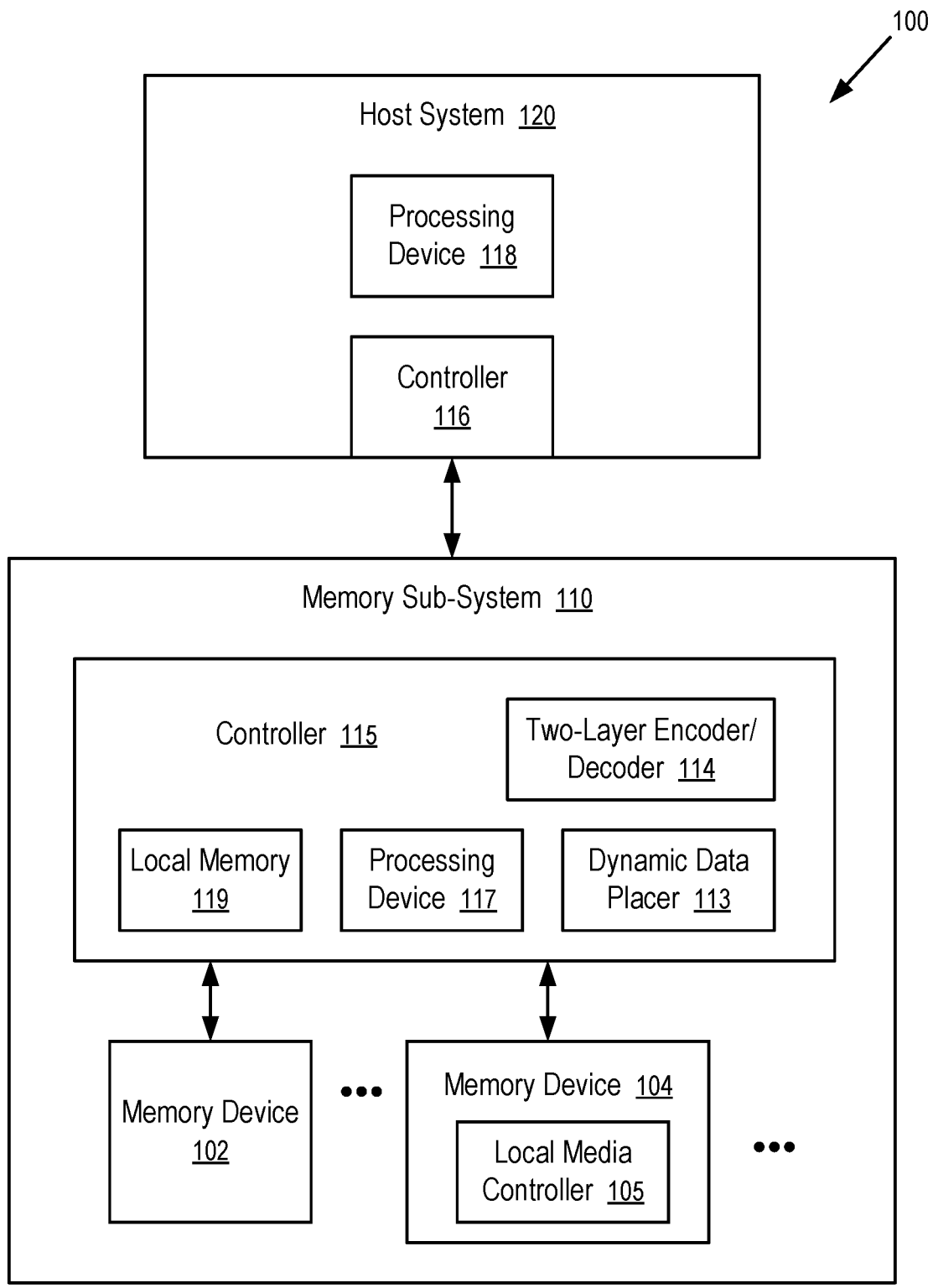
FIG. 1 illustrates an example computing system that includes a memory sub-system in accordance with some embodiments of the present disclosure.

At least some aspects of the present disclosure are directed to dynamic data placement in a memory sub-system and a two-layer code with low parity cost to encode data for storage in the memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A media layout specifies the mapping between the addresses used in commands received in a memory sub-system from a host system and the physical memory locations in the memory media of the memory sub-system. Fixed media layouts can lead to media access collisions among active write streams, increased buffer lifetime, and/or increased buffering requirements. Buffer lifetime corresponds to the lifetime of data being buffered in a memory sub-system before the data is committed, written, stored, or programmed into the memory media of the memory sub-system. For example, the host system to which a memory sub-system is connected to, a garbage collection process running in the memory sub-system, and/or one or more write streams from the host system (e.g., for writing in different zones of a namespace configured in the memory subsystem) can generate multiple streams of write commands. The memory media can have multiple memory devices capable of writing data in parallel. Thus, at least some of the streams of write commands can be executed in the memory sub-system in parallel in committing date into the memory media of the memory sub-system. However, one memory device can support one write operation at a time. When two write commands are mapped by the media layout to operate on a same memory device, an access collision occurs. Each collision increases the corresponding buffer lifetime. The media layout can be randomized by mapping logical addresses to random memory locations in the memory media of the memory sub-system. Randomized media layout can reduce collisions. However, when a predetermined media layout is used, collisions can still occur even when the number of write streams is equal to or smaller than the number of memory devices that can independently perform write operations in parallel.

At least some aspects of the present disclosure address the above and other deficiencies through dynamic data placement. For example, the determination of the portion of a media layout for the logical addresses used in incoming write commands can be postponed until the write commands can be executed without collision. When the memory media is configured on integrated circuit dies (e.g., as NAND memory cells), the media layout determination can be based on the identification of integrated circuit dies that are available for performing write operations at the time of input/output scheduling. The media layout is determined such that logical addresses of the commands to be executed in parallel are mapped to different integrated circuit dies that are available for concurrent/parallel operations without collision. Thus, media access collisions among the write commands from different active streams can be completely avoided. When the number of active write streams is less than the number of integrated circuit dies in the memory sub-system, no media access collisions can occur when dynamic media layout is used. In general, a write stream includes a set of commands to write, trim, overwrite a set of data together as a group. In the group, the data can be written in a logical space sequentially, randomly, or pseudo-sequentially. Preferably, the data in the group is written into an erase block set, where memory cells in the erase block set store data for the stream but not data from other streams. The erase block set can be erased to remove the data of the stream without erasing the data of other streams. In some instances, collisions can occur when the logical addresses of different streams are mapped into a same erase block set where the data of different streams cannot be separately erased. Such collision can also be avoided through the dynamic media layout technique. Optionally, the data to be stored in the memory sub-system can be dynamically placed across multiple integrated circuit dies and planes of memory cells for multi-pass programming for a best or improved match between an allocated storage capacity for the next atomic write operation and the size of the data to be stored in the allocated storage capacity.

FIG. 1 illustrates an example computing system 100 that includes a memory sub-system 110 in accordance with some embodiments of the present disclosure. The memory sub-system 110 can include media, such as one or more volatile memory devices (e.g., memory device 102), one or more non-volatile memory devices (e.g., memory device 104), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset (e.g., processing device 118) and a software stack executed by the processor chipset. The processor chipset can include one or more cores, one or more caches, a memory controller (e.g., controller 116) (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a Serial Advanced Technology Attachment (SATA) interface, a Peripheral Component Interconnect Express (PCIe) interface, Universal Serial Bus (USB) interface, Fibre Channel, Serial Attached SCSI (SAS), a Double Data Rate (DDR) memory bus, Small Computer System Interface (SCSI), a Dual In-line Memory Module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 104) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The processing device 118 of the host system 120 can be, for example, a microprocessor, a central processing unit (CPU), a processing core of a processor, an execution unit, etc. In some instances, the controller 116 can be referred to as a memory controller, a memory management unit, and/or an initiator. In one example, the controller 116 controls the communications over a bus coupled between the host system 120 and the memory sub-system 110. In general, the controller 116 can send commands or requests to the memory sub-system 110 for desired access to memory devices 102, 104. The controller 116 can further include interface circuitry to communicate with the memory sub-system 110. The interface circuitry can convert responses received from the memory sub-system 110 into information for the host system 120.

The controller 116 of the host system 120 can communicate with the controller 115 of the memory sub-system 110 to perform operations such as reading data, writing data, or erasing data at the memory devices 102, 104 and other such operations. In some instances, the controller 116 is integrated within the same package of the processing device 118. In other instances, the controller 116 is separate from the package of the processing device 118. The controller 116 and/or the processing device 118 can include hardware such as one or more integrated circuits (ICs) and/or discrete components, a buffer memory, a cache memory, or a combination thereof. The controller 116 and/or the processing device 118 can be a microcontroller, special purpose logic circuitry (e.g., a Field Programmable Gate Array (FPGA), an Application Specific Integrated Circuit (ASIC), etc.), or another suitable processor.

The memory devices 102, 104 can include any combination of the different types of non-volatile memory components and/or volatile memory components. The volatile memory devices (e.g., memory device 102) can be, but are not limited to, Random Access Memory (RAM), such as Dynamic Random Access Memory (DRAM) and Synchronous Dynamic Random Access Memory (SDRAM).

Some examples of non-volatile memory components include a Negative-AND (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 104 can include one or more arrays of memory cells. One type of memory cell, for example, Single Level Cells (SLCs) can store one bit per cell. Other types of memory cells, such as Multi-Level Cells (MLCs), Triple Level Cells (TLCs), Quad-Level Cells (QLCs), and penta-level cells (PLCs) can store multiple bits per cell. In some embodiments, each of the memory devices 104 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 104 can be grouped as pages that can refer to a logical unit of the memory device used to store data. With some types of memory (e.g., NAND), pages can be grouped to form blocks.

Although non-volatile memory devices such as 3D cross-point type and NAND type memory (e.g., 2D NAND, 3D NAND) are described, the memory device 104 can be based on any other type of non-volatile memory, such as Read-Only Memory (ROM), Phase Change Memory (PCM), self-selecting memory, other chalcogenide based memories, Ferroelectric Transistor Random-Access Memory (Fe-TRAM), Ferroelectric Random Access Memory (FeRAM), Magneto Random Access Memory (MRAM), Spin Transfer Torque (STT)-MRAM, Conductive Bridging RAM (CBRAM), Resistive Random Access Memory (RRAM), Oxide based RRAM (OxRAM), Negative-OR (NOR) flash memory, and Electrically Erasable Programmable Read-Only Memory (EEPROM).

A memory sub-system controller 115 (or controller 115 for simplicity) can communicate with the memory devices 104 to perform operations such as reading data, writing data, or erasing data at the memory devices 104 and other such operations (e.g., in response to commands scheduled on a command bus by controller 116). The controller 115 can include hardware such as one or more Integrated Circuits (ICs) and/or discrete components, a buffer memory, or a combination thereof. The hardware can include digital circuitry with dedicated (i.e., hard-coded) logic to perform the operations described herein. The controller 115 can be a microcontroller, special purpose logic circuitry (e.g., a Field Programmable Gate Array (FPGA), an Application Specific Integrated Circuit (ASIC), etc.), or another suitable processor.

The controller 115 can include a processing device 117 (processor) configured to execute instructions stored in a local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include Read-Only Memory (ROM) for storing micro-code. While the example memory sub-system 110 in FIG. 1 has been illustrated as including the controller 115, in another embodiment of the present disclosure, a memory sub-system 110 does not include a controller 115, and can instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory devices 104. The controller 115 can be responsible for other operations such as wear leveling operations, garbage collection operations, error detection and Error-Correcting Code (ECC) operations, encryption operations, caching operations, and address translations between a logical address (e.g., Logical Block Address (LBA), namespace) and a physical address (e.g., physical block address) that are associated with the memory devices 104. The controller 115 can further include host interface circuitry to communicate with the host system 120 via the physical host interface. The host interface circuitry can convert the commands received from the host system into command instructions to access the memory devices 104 as well as convert responses associated with the memory devices 104 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory devices 104.

In some embodiments, the memory devices 104 include local media controllers 105 that operate in conjunction with the memory sub-system controller 115 to execute operations on one or more memory cells of the memory devices 104. An external controller (e.g., memory sub-system controller 115) can externally manage the memory device 104 (e.g., perform media management operations on the memory device 104). In some embodiments, a memory device 104 is a managed memory device, which is a raw memory device combined with a local controller (e.g., local controller 105) for media management within the same memory device package. An example of a managed memory device is a Managed NAND (MNAND) device.

The computing system 100 can optionally include a dynamic data placer 113 in the memory sub-system 110 that dynamically determines the media layout to place data associated with logical addresses in the media units/memory devices 102 to 104. The computing system 100 can optionally include a two-layer encoder/decoder 114 in the memory sub-system 110 that uses a combination of an error correcting code and an erasure code to convert data for storing in the media units 109A to 104. In some embodiments, the controller 115 in the memory sub-system 110 includes at least a portion of the dynamic data placer 113 and/or the two-layer encoder/decoder 114. In other embodiments, or in combination, the controller 116 and/or the processing device 118 in the host system 120 includes at least a portion of the dynamic data placer 113 and/or the two-layer encoder/decoder 114. For example, the controller 115, the controller 116, and/or the processing device 118 can include logic circuitry implementing the dynamic data placer 113 and/or the two-layer encoder/decoder 114. For example, the controller 115, or the processing device 118 (processor) of the host system 120, can be configured to execute instructions stored in memory for performing the operations of the dynamic data placer 113 and/or the two-layer encoder/decoder 114 described herein. In some embodiments, the dynamic data placer 113 and/or the two-layer encoder/decoder 114 is implemented in an integrated circuit chip disposed in the memory sub-system 110. In other embodiments, the dynamic data placer 113 and/or the two-layer encoder/decoder 114 is part of an operating system of the host system 120, a device driver, or an application.

The dynamic data placer 113 can determine the media layout for a portion of logical addresses for the placement of data at the logical addresses in the media units/memory devices 102 to 104, based on the availability of the media units/memory devices 102 to 104 to write, program, store, commit data at the time of input/output scheduling in the memory sub-system 110. When a media unit/memory device (e.g., 102 or 104) is available for committing/programming data, a write command is scheduled for execution in the memory sub-system 110; and the dynamic data placer 113 generates a portion of the media layout for the write command and maps the logical address(es) used in the write command to identify memory locations with the media unit/memory device (e.g., 102 or 104). The execution of the write command causes the memory sub-system 110 to committing/programming data associated with the write command into the media unit/memory device (e.g., 102 or 104). Since the media unit/memory device (e.g., 102 or 104) are known to be available for committing/programming data, independent of the operations of other media unit/memory device (e.g., 102 or 104), there is no media access collision in the execution of the write commands. When there are multiple media units/memory devices (e.g., 102 and 104) available, logical addresses used in the commands from multiple write streams can be mapped by the dynamically generated portion of the media layout to the multiple media units/memory devices (e.g., 102 and 104) respectively, such that there is no media access collision in the execution of the commands from the multiple write streams. Further details with regards to the operations of the dynamic data placer 113 are described below.

Figure 2:
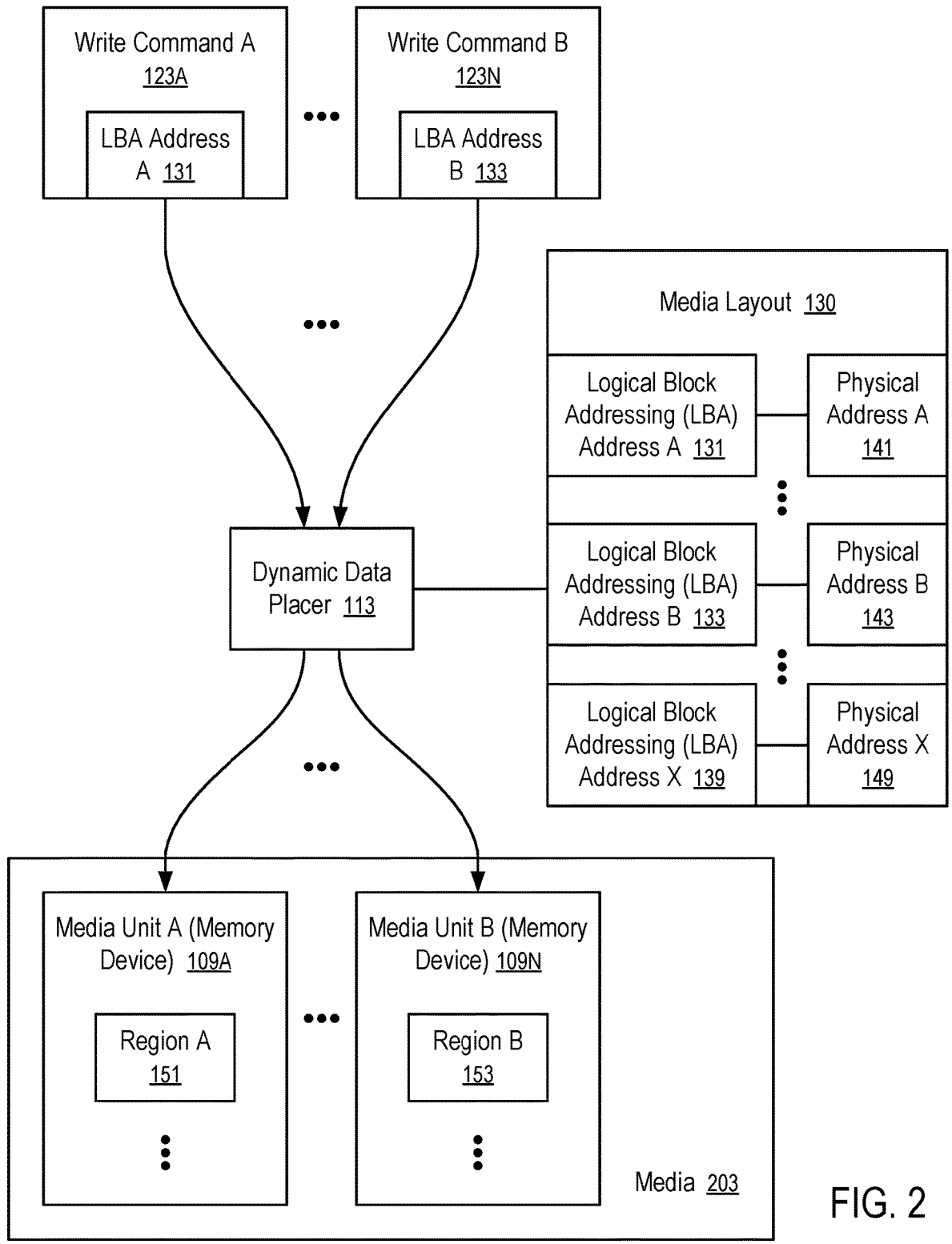
FIG. 2 shows a dynamic data placer configured to determine a media layout in a way that reduces and/or avoids collisions in concurrent media accesses in writing data.

FIG. 2 shows a dynamic data placer 113 configured to determine a media layout 130 in a way that reduces and/or avoids collisions in concurrent media accesses in writing data. For example, the dynamic data placer 113 and the media layout 130 can be implemented in the computer system 100 of FIG. 1.

In FIG. 2, multiple write commands 123A to 123N are scheduled for execution in parallel. The number of write commands 123A to 123N scheduled for parallel execution is based on the number of media units/memory devices 109A to 109N (e.g., memory devices 102 and/or 104 illustrated in FIG. 1) that are available for parallel operations. The write commands 123A to 123N can be from multiple write streams respectively.

The write commands 123A to 123N specify locations for the write operations using logical block addressing (LBA) addresses 131, . . . , 133.

At the time of scheduling the write commands 123A to 123N, the dynamic data placer 113 generates the mapping of the logical block addressing (LBA) addresses 131, . . . , 133 to physical addresses 141, . . . , 143. Since the media units/memory devices 109A to 109N are determined to be available for parallel write operations, the dynamic data placer 113 maps each of the LBA addresses 131, . . . , 133 into a different one of the media units/memory devices 109A, . . . , 109N. Thus, the physical addresses 141, . . . , 143 for the LBA addresses 131, . . . , 133 correspond to memory regions 151, . . . , 153 in different media units/memory devices 109A, . . . , 109N. Since no two of the physical addresses 141, . . . , 143 are for memory regions in a same media unit (e.g., 109A or 109N), there can be no collision in the parallel execution of the write commands 123A, . . . , 123N. Thus, media access collisions are eliminated.

In general, the write operations across the different media units/memory devices 109A to 109N may not be in unison. Thus, when a subset of the media units/memory devices 109A, . . . , 109N becomes available for next write operations, another subset of the media units/memory devices 109A, . . . , 109N can be still busy in their operations and not available for next write operations. Some of the media units/memory devices 109A, . . . , 109N can be busy in performing other operations, such as read operations, erasure operations, and thus not available for performing write operations. In general, when one or more write commands are scheduled for the available subset of the media units/memory devices 109A, . . . , 109N, the dynamic data placer 113 generates the portion of the media layout 130 to map the LBA address of the scheduled write commands to the physical addresses of memory regions in the available subset of the media units/memory devices 109A, . . . , 109N. Thus, the scheduled commands can be executed with media access collisions.

Figure 3:
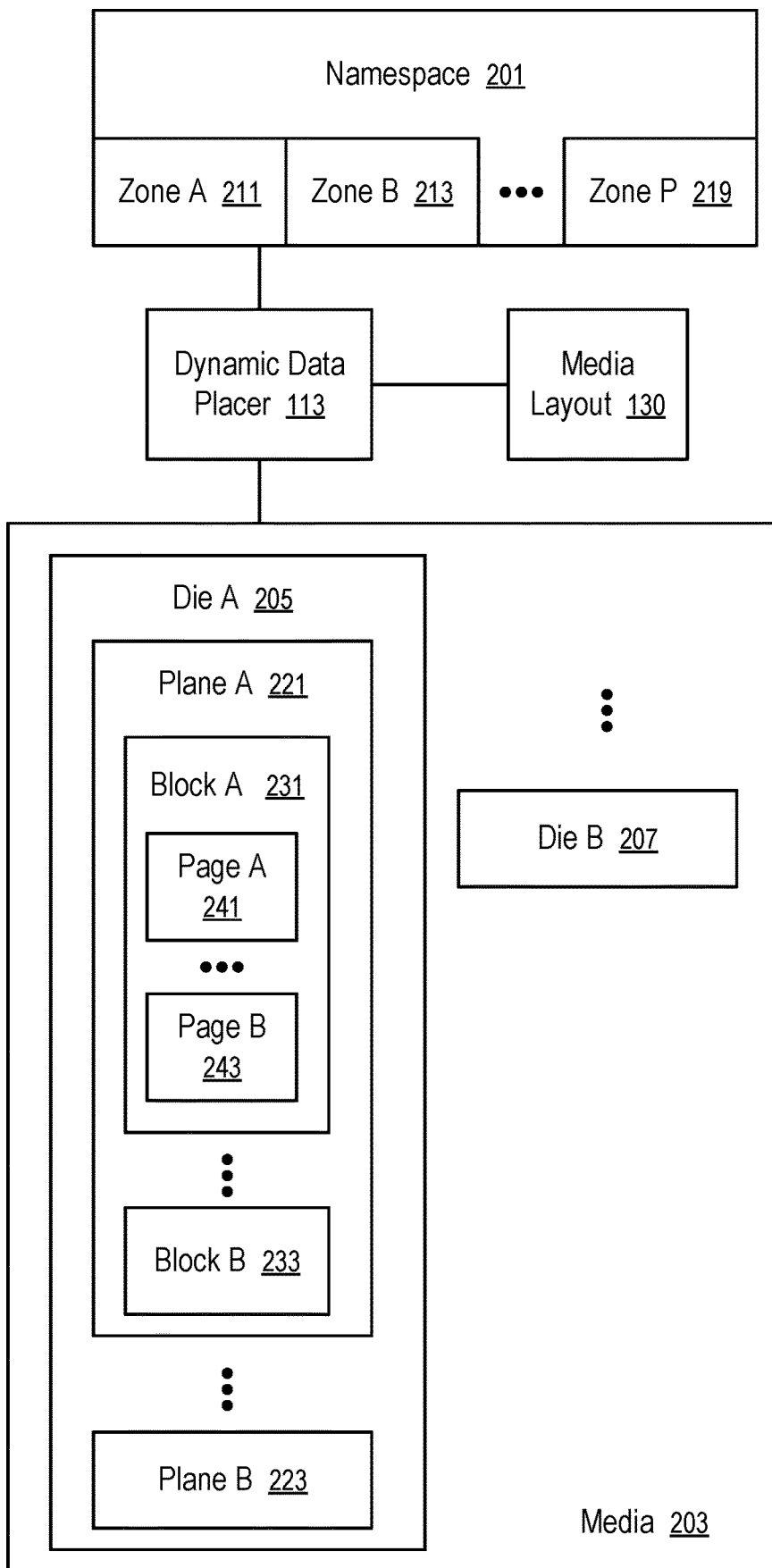
FIG. 3 shows an example of a memory sub-system having dynamic data placement.

FIG. 3 shows an example of a memory sub-system having dynamic data placement. For example, the memory sub-system of FIG. 3 can be implemented in the memory sub-system 110 of FIG. 1 using a dynamic data placer 113 of FIG. 2. However, the techniques of FIG. 1 and FIG. 2 are not limited to the implementation of the memory sub-system illustrated in FIG. 3. For example, the techniques can be implemented in a plain block device, a device that supports namespaces, or a device that supports zoned names spaces (e.g., a memory sub-system illustrated in FIG. 3). Thus, the disclosure presented herein is not limited to the example of FIG. 3.

In FIG. 3, a namespace 201 is configured on the media storage capacity of the memory sub-system 110. The namespace 201 provides a logical block addressing space that can be used by the host system 120 to specify memory locations for read or write operations. The namespace 201 can be allocated on a portion of the media storage capacity of the memory sub-system 110, or the entire media storage capacity of the memory sub-system 110. In some instances, multiple namespaces can be allocated on separate, non-overlapping portions of the media storage capacity of the memory sub-system 110.

In FIG. 3, the namespace 201 is configured with a plurality of zones 211, 213, . . . , 219. Each zone (e.g., 211) in the namespace allows random read access to LBA addresses in the zone (e.g., 211) and sequential write access to LBA addresses in the zone (e.g., 211), but does not allow random write access to random LBA addresses in the zone (211). Thus, writing data into a zone (e.g., 211) is performed in a predetermined, sequential order in the LBA address space of the namespace 201.

When a zone (e.g., 211) in the namespace 201 is configured, it is possible to predetermine the media layout for the zone (e.g., 211) (e.g., for simplicity). The LBA addresses in the zone (e.g., 211) can be pre-mapped to the media 203 of the memory sub-system 110. However, such a predetermined media layout can cause media access collisions when there are multiple parallel write streams, as discussed above. Randomize the mapping from LBA addresses in the zone (e.g., 211) to memory locations in the media 203 can reduce collisions but cannot eliminate collisions.

Preferably, the dynamic data placer 113 is configured in the memory sub-system 110 to create portions of the media layout 130 at the time of the scheduling of write commands for execution such that collisions are complete eliminated.

For example, the media 203 of the memory sub-system 110 can have multiple integrated circuit dies 205, . . . , 207. Each of the integrated circuit dies (e.g., 205) can have multiple planes 221, . . . , 223 of memory units (e.g., NAND memory cells). Each of the planes (e.g., 221) can have multiple blocks 231, ..., 233 of memory units (e.g., NAND memory cells). Each of the blocks (e.g., 231) can have multiple pages 241, ..., 243 of memory units (e.g., NAND memory cells). The memory units in each page (e.g., 241) is configured to be programmed to store/write/commit data together in an atomic operation; and the memory units in each block (e.g., 231) is configured to be erased data together in an atomic operation.

When a write command (e.g., 123A) for storing data in one zone (e.g., 211) and another write command (e.g., 123N) for storing data in another zone (e.g., 213) are scheduled for parallel execution as a result of two integrated circuit dies (e.g., 205 and 207) are available for concurrent operations, the dynamic data placer 113 maps the LBA addresses (e.g., 131 and 133) of the write commands (e.g., 123A and 123N) into pages located in the different dies (e.g., 205 and 207). Thus, media access collisions can be avoided.

Figure 4:
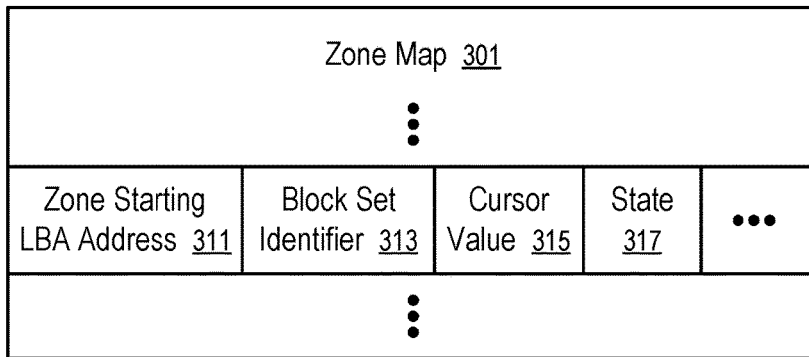
FIG. 4 illustrates an example of data structures configured to support dynamic data placement.
Figure 4:
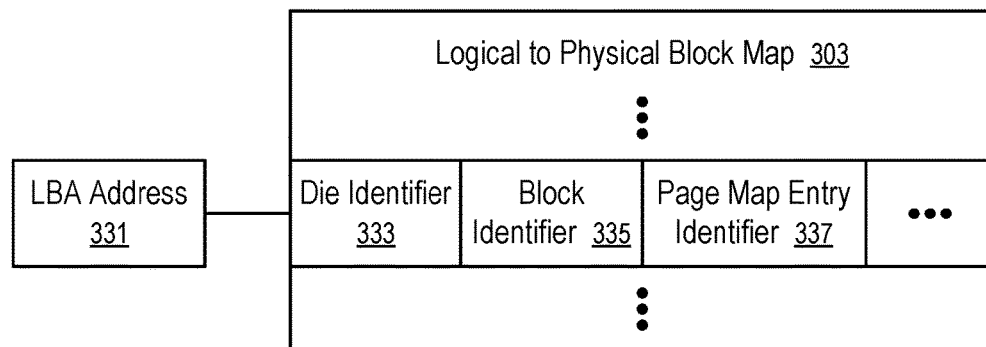
Figure 4:
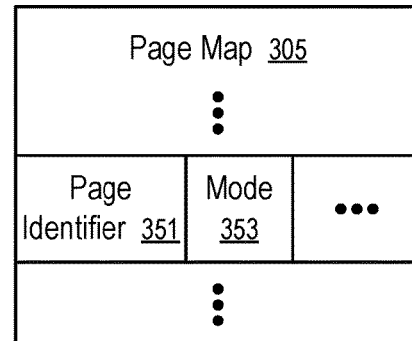
Figure 4:
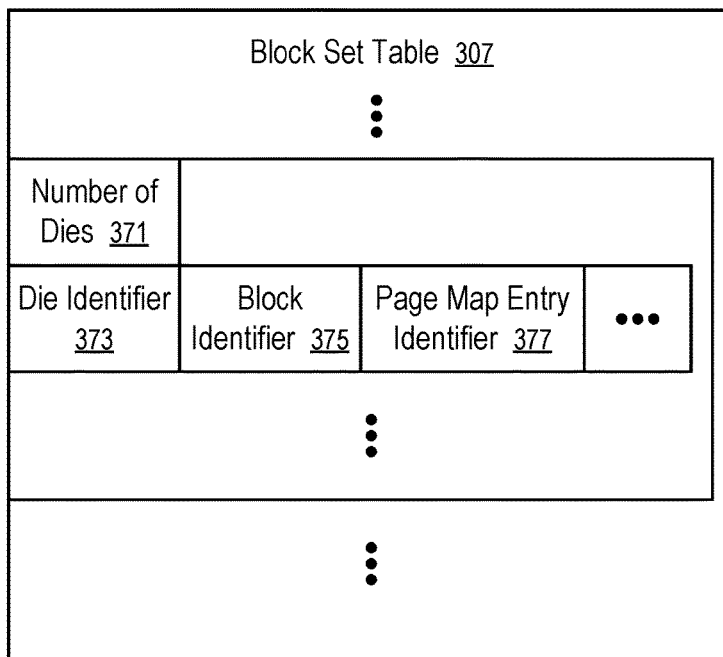

FIG. 4 illustrates an example of data structures configured to support dynamic data placement. For example, the media layout 130 of FIG. 2 or 3 can be implemented using the data structures of FIG. 4.

In FIG. 4, a zone map 301 is configured to provide media layout information for a zone (e.g., 211) in a namespace (e.g., 201). The zone map 301 can have multiple entries. Each entry in the zone map 301 identifies information about a zone (e.g., 211), such as a starting LBA address 311 of the zone (e.g., 211), a block set identifier 313 of the zone (e.g., 211), a cursor value 315 of the zone (e.g., 211), a state 317 of the zone (e.g., 211), etc.

The host system 120 writes data in the zone (e.g., 211) starting at the zone starting LBA address 311. The host system 120 writes data in the zone (e.g., 211) sequentially in the LBA space. After an amount of data has been written into the zone (e.g., 211), the current starting LBA address for writing subsequent data is identified by the cursor value 315. Each write command for the zone moves the cursor value 315 to a new starting LBA address for the next write command for the zone. The state 317 can have a value indicating that the zone (e.g., 211) is empty, full, implicitly open, explicitly open, closed, etc.

In FIG. 4, a logical to physical block map 303 is configured to facilitate the translation of LBA addresses (e.g., 331) into physical addresses in the media (e.g., 203).

The logical to physical block map 303 can have multiple entries. An LBA address (e.g., 331) can be used as, or converted into, an index for an entry in the logical to physical block map 303. The index can be used to look up an entry for the LBA address (e.g., 331). Each entry in the logical to physical block map 303 identifies, for an LBA address (e.g., 331), the physical address of a block of memory in the media (e.g., 203). For example, the physical address of the block of memory in the media (e.g., 203) can include a die identifier 333, a block identifier 335, a page map entry identifier 337, etc.

A die identifier 333 identifies a specific integrated circuit die (e.g., 205 or 207) in the media 203 of the memory sub-system 110.

A block identifier 335 identifies a specific block of memory (e.g., NAND flash memory) within the integrated circuit die (e.g., 205 or 207) that is identified using the die identifier 333.

A page map entry identifier 337 identifies an entry in a page map 305.

The page map 305 can have multiple entries. Each entry in the page map 305 can include a page identifier 351 that identifies a page of memory cells within a block of memory cells (e.g., NAND memory cells). For example, the page identifier 351 can include a word line number for the page and a sub block number for the page in the block of NAND memory cells. Further, the entry for the page can include a programming mode 353 of the page. For example, the page can be programmed in an SLC mode, an MLC mode, a TLC mode, or a QLC mode. When configured in the SLC mode, each memory cell in the page is to store one bit of data. When configured in the MLC mode, each memory cell in the page is to store two bits of data. When configured in the TLC mode, each memory cell in the page is to store three bits of data. When configured in the QLC mode, each memory cell in the page is to store four bits of data. Different pages in an integrated circuit die (e.g., 205 or 207) can have different modes for data programming.

In FIG. 4, the block set table 307 stores data controlling aspects of the dynamic media layout for a zone (e.g., 211).

The block set table 307 can have multiple entries. Each entry in the block set table 307 identifies a number/count 371 of integrated circuit dies (e.g., 205 and 207) in which data of the zone (e.g., 211) is stored. For each of the integrated circuit dies (e.g., 205 and 207) used for the zone (e.g., 211), the entry of the block set table 307 has a die identifier 373, a block identifier 375, a page map entry identifier 377, etc.

The die identifier 373 identifies a specific integrated circuit die (e.g., 205 or 207) in the media 203 of the memory sub-system 110, on which die (e.g., 205 or 207) subsequent data of the zone (e.g., 211) can be stored.

The block identifier 375 identifies a specific block (e.g., 231 or 233) of memory (e.g., NAND flash memory) within the integrated circuit die (e.g., 205 or 207) that is identified using the die identifier 373, in which block (e.g., 231 or 233) the subsequent data of the zone (e.g., 211) can be stored.

The page map entry identifier 337 identifies an entry in the page map 305, which identifies a page (e.g., 241 or 241) that can be used to store the subsequent data of the zone (e.g., 211).

For example, a memory sub-system 110 receives multiple streams of write commands. For example, each respective stream in the multiple streams is configured to write data sequentially in a logical address space in one embodiment; and in another embodiment, a stream in the multiple streams is configured to write data pseudo-sequentially, or randomly in a logical address space in one embodiment. Each write stream includes a set of commands that are tagged to write, trim, overwrite a set of data together as a group. In the group, the data can be written in a logical space sequentially, randomly, or pseudo-sequentially. Preferably, the data in the group is written into an erase block set, where memory cells in the erase block set store data for the stream but not data from other streams. The erase block set can be erased to remove the data of the stream without erasing the data of other streams.

For example, each of write streams is permitted to sequentially write at LBA addresses in a zone (e.g., 211) in a namespace (e.g., 201) allocated on a media 203 of the memory sub-system 110, but prohibited from writing data out of sequence in the LBA address space.

A dynamic data placer 113 of the memory sub-system 110 identifies multiple media units (e.g., 109A to 109N) in the memory sub-system that are available to write data concurrently.

The dynamic data placer 113 selects first commands from the multiple streams for concurrent execution in the multiple media units that are available to write data.

The dynamic data placer 113 generates and stores, dynamically in response to the first commands being selected for concurrent execution in the multiple media units, a portion of a media layout 130 that maps from logical addresses identified by the first commands in the logical address space to physical addresses of memory units in the multiple media units.

The memory sub-system 110 executes the first commands concurrently by storing data into the memory units according to the physical addresses.

For example, at the time of scheduling the first commands for execution, execution second commands can be in progress in a subset of memory units of the media of the memory sub-system 110. Thus, the subset of memory units used for the execution of the second commands are not available for the first commands. After the first commands are scheduled and the portion of the media layout for the logical addresses used in the first commands is determined, the first commands can be executed in the multiple media units concurrently and/or concurrently with the progress of the execution of the second commands in remaining media units of the memory sub-system 110.

For example, after the identification of the multiple memory units (e.g., integrated circuit dies) that are available for the execution of next commands, the dynamic data placer 113 can identify, from the block set table 307, the physical addresses that can be used to store data of the next commands. The physical addresses can be used to update the corresponding entries in the logical to physical block map 303 for the LBA addresses used in the next commands.

For example, when an integrated circuit die (e.g., 205) is free to write data, the dynamic data placer 113 can determine a command of a zone that can be written/programmed into the memory cells in the integrated circuit die (e.g., 205). From the block set table 307, the dynamic data placer 113 locates an entry for the zone (e.g., 211), locate the block identifier 375 and the page map entry identifier 377 associated with the identifier 373 of the integrated circuit die (e.g., 205), and use the die identifier 373, the block identifier 375, and the page map entry identifier 377 to update the corresponding fields of the entry in the logical to physical block map 303 for the LBA address 331 used in the command of the zone (e.g., 211). Thus, the command of the zone (e.g., 211) can be executed without media access collision for the LBA address 331.

Figure 5:
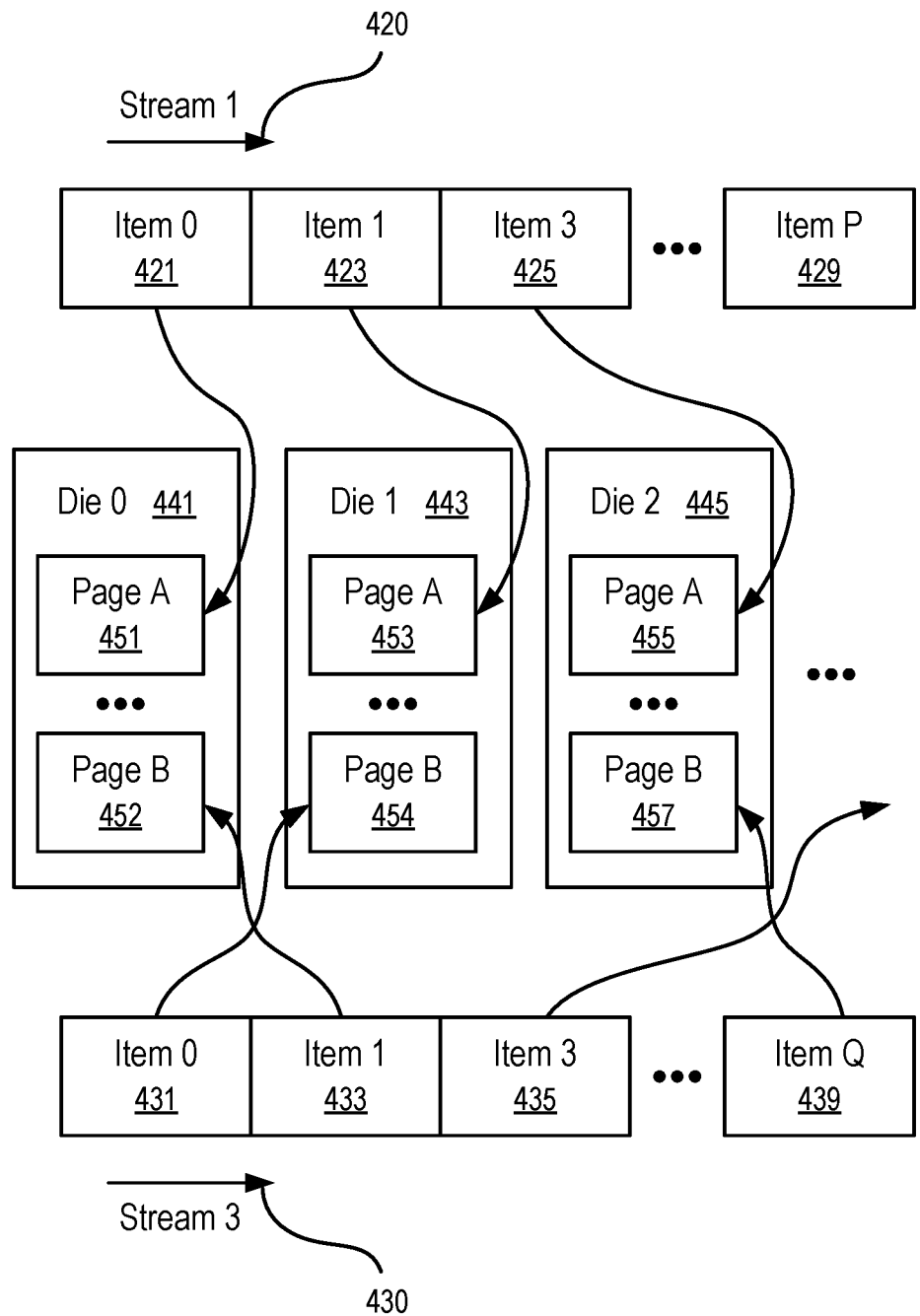
FIG. 5 illustrates an example of dynamic media layout determination.

FIG. 5 illustrates an example of dynamic media layout determination.

In the example of FIG. 5, two concurrent write streams 420 and 430 are illustrated. Stream 420 has items 421, 423, 425, . . . , 429 to be written into memory cells of integrated circuit dies 441, 443, 445, . . . . Stream 430 has items 431, 433, 435, . . . , 439 to be written into memory cells of integrated circuit dies 441, 443, 445, . . . . If item 421 of stream 420 and item 431 of stream 430 are assigned to be written into the same die (e.g., 441), a collision occurs, since the die (e.g., 441) cannot be used to concurrently write the item 421 of stream 420 and the item 431 of stream 430. Thus, a dynamic data placer (e.g., 113 in FIG. 1, 2, or 3) assigns the items 421 and 431 of concurrent streams 420 and 430 to pages 451 and 454 in different dies 441 and 443, as illustrated in FIG. 5. Similarly, items 423 and 433 from the concurrent streams 420 and 430 are assigned to pages 453 and 42 in different dies 443 and 441. For example, when the item 425 of stream 420 is assigned to page 455 in die 455, the concurrently item 435 is assigned to be written into a page in another die; and the page 457 in the die 445 can be assigned to item 439 of stream 430 that is not written/programmed concurrently with the item 425 of stream 420. Thus, collisions are avoided. The dynamic media layout changes the order of items being written relative to the order of the dies 441, 443, 445, . . . . For example, items 421 to 429 of stream 420 are written into the dies 441, 443, 445, . . . in one order; and items 431 to 439 of stream 430 are written into the dies 441, 443, 445, . . . in another order, such that the streams 420 and 430 do not access the same die at the same time. In FIG. 5, the data of different streams 420 and 430 are tagged to be written into different erase blocks. For example, page 451 in die 441 for storing the data item 421 of stream 420 and page 452 in die 441 for storing the data item 431 of stream 430 are in separate erase block sets, such that page 451 of stream 420 can be erased without erasing page 452 storing the data of stream 430 and such that page 452 of stream 430 can be erased without erasing page 451 storing the data of stream 420.

In at least some embodiments disclosed herein, the dynamic data placer 113 can place data across multiple integrated circuit dies (e.g., 205 to 207) and planes (e.g., 221 to 223) of memory cells for multi-pass programming of data that is provided by the host system 120 for storing in the memory sub-system 110. The flexibility of multi-pass programming of data across multiple integrated circuit dies (e.g., 205 to 207) and planes (e.g., 221 to 223) allows the dynamic data placer 113 to improve the match between a dynamically allocated storage capacity for the next atomic write operation and the size of the data to be stored in the allocated storage capacity. The improved match can reduce or eliminate the need to pad zeros for the data programming operation, reduce the time of data being buffered in the memory sub-system, reduce wear amplification and storage space amplification, and improve storage performance.

For example, the memory sub-system 110 can have NAND (negative-and) flash memory. An atomic write/programming operation programs a page (e.g., 241) of memory cells together to store data. If the size of the data to be programmed/written into the page is less than the size of the page, zeros (or other values) can be padded/added to the data for programming the entire page (e.g., 241) together. However, the padded zeros (or other values) reduce the utilization rate of the storage capacity of the page (e.g., 241) and can increase wear amplification and storage space amplification. On the other hand, if the memory sub-system 110 receives more data than that can be programmed into a page (e.g., 241), a portion of the received data can be buffered in the memory sub-system 110 for the next atomic write operation. However, buffering the excessive data in the memory to wait for the next operation can increase the time and amount of data to be buffered in the memory sub-system 110 and thus increase the capacity requirement of a power-fail hold up circuit that is used to power the volatile buffer memory (e.g., 119) of the memory sub-system 110 during a power failure event until the data in the buffer memory (e.g., 119) can be flushed into a non-volatile memory.

An atomic write operation can be implemented in various ways in a NAND device. Using a single pass programming technique, an atomic write operation in the NAND device can program/store data into a single plane page, a dual plane page, a quad plane page, or a multi-plane page. Using a multi-pass programming technique, an atomic write operation in a NAND device can program/store data into a page in an SLC (single level cell) mode, a page in an MLC (multi-level cell) mode, a page in a TLC (triple level cell) mode, or a page in a QLC (quad-level cell) mode. A page programmed in an atomic write operation can have different sizes in different modes. For example, an SLC page can have a size of 64 Kilobytes (KB); an MLC or TLC page can have a size of 128 KB; and a QLC page can have a size of 64 KB using a multi-pass programming method.

When the pages of data of different write streams of different program modes are interleaved in the NAND device, the size of the next available page can vary among the blocks (e.g., 221 to 223) of NAND memory cells on different integrated circuit dies (e.g., 205 to 207) of the NAND device.

When a NAND device supports a multi-pass programming technique, a given amount of data can be programmed in different combinations of programming modes and locations of memory pages for different passes. For example, when the memory sub-system 110 receives 192 KB of data from the host system, the NAND device can be configured to program the data using three first pass SLC programming on three single plane pages in three integrated circuit dies respectively, where each of the integrated circuit dies performs an atomic operation of a first pass SLC programming of 64 KB of data. Alternatively, the NAND device can be configured to program the data using a first pass SLC programming on a single plane page in one integrated circuit die and a second pass TLC or MLC programming on another single plane page in the same integrated circuit die or in another integrated circuit die.

Using the various programming options, the dynamic data placer 113 can dynamically determine the placement of data in the integrated circuit dies 205 to 207 based on the availability of the integrated circuit dies 205 to 207 to perform the data programming operations, and data programming modes (e.g., 353) of next available blocks (e.g., 231) in the integrated circuit dies (e.g., 205) that are available to perform the data programming operations.

For example, when the memory sub-system 110 receives one or more commands from the host system to store an amount of host data of a given size, the dynamic data placer 113 queues the one or more commands (e.g., in the local memory 119) and determine a portion of the media layout 130 for the physical placement of the data in the integrated circuit dies 205 to 207. When an integrated circuit die (e.g., 205) is available to perform a data programming operation, the dynamic data placer 113 allocates a portion of the host data (to be retrieved from the host system 120) for the data programming operation in the integrated circuit die (e.g., 205). The amount of data allocated to the integrated circuit die (e.g., 205) is based on the data programming mode (353) of a page (e.g., 241) in the available block (e.g., 231). such an operation of allocating data to the next available integrated circuit die is repeated until the entire host data is allocated to a set of integrated circuit dies (e.g., 205 and 207), where each of the integrated circuit dies (e.g., 205 and 207) is used to store a portion of the host data using one atomic data writing operation. The storage capacities (e.g., pages) allocated from multiple integrated circuit dies (e.g., 205 and 207) can be combined for multi-pass programming. In response to the completion of the physical storage allocation, the memory sub-system 110 can allocate a buffer space for the transfer of the host data; and different data portions are transferred into the different circuit dies (e.g., 205 and 207) according to the dynamically determined physical storage allocation so that the integrated circuit dies (e.g., 205 and 207) can perform the respective data programming operations to store their data portions.

Figure 6:
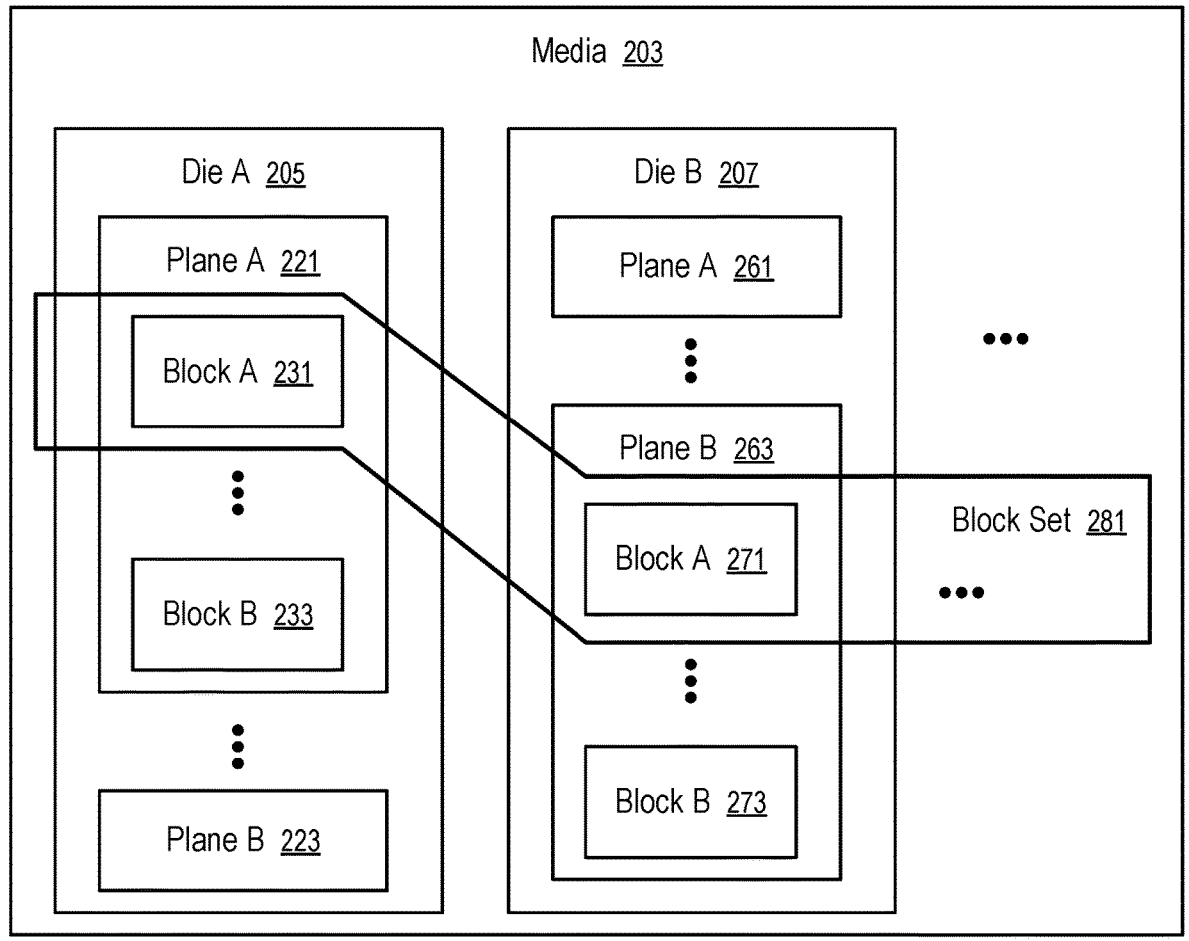
FIG. 6 illustrates a block set allocated across integrated circuit dies for multi-pass programming of data.

FIG. 6 illustrates a block set 281 allocated across integrated circuit dies 205 to 207 for multi-pass programming of data.

In FIG. 6, the integrated circuit die A 205 has planes 221 to 223 and blocks (e.g., 231 to 233); and the integrated circuit die B 207 has planes 261 to 263 and blocks (e.g., 271 to 273).

A block set 281 is allocated for a stream. The data of the stream is stored in the block set 281; and data of other streams is not stored in the block set 281. Thus, when the block set 281 is erased, only the data of the stream is erased. The entire data of the stream can be erased by erasing the block set 281.

The block set 281 can be identified using an entry in the block set table 307 illustrated in FIG. 4. In general, the block set 281 can be allocated on a subset of the integrated circuit dies (e.g., 205, 207, . . . ) in the media 203. For each of the blocks (e.g., 271), the entry in the block set table 307 identifies the die (e.g., 207) using the die identifier (e.g., 373), the block (e.g., 271) within the die (e.g., 207) using the block identifier (e.g., 375), and a next page in the block that is available for storing data using a page map entry identifier 377. The page map entry identifier 373 identifies an entry in the page map 305. The entry in the page map 305 shows the page identifier 351 of the page within the block (e.g., 271) and the programming mode 353.

In the block set 281, the dynamic data placer 113 can allocate one page from one die (e.g., 205) that is available to program data and repeat the allocation from another die (e.g., 207). The dynamic data placer 113 can allocate the separate pages from different dies for multi-pass programming and select the dies for allocation to reduce or eliminate padding until the entire host data to be communicated from the host system 120 to the memory sub-system together in one communication is allocated.

In a method to dynamic data placement for multi-pass programming of data across integrated circuit dies, a memory sub-system 110 receives, from a host system 120, a command identifying a size of data to be stored in the memory sub-system 110.

The command is queued in the memory sub-system 110 having memory cells formed on a plurality of integrated circuit dies 205 to 207.

The dynamic data placer 113 allocates pages of memory cells in multiple dies (e.g., 205 and 207) in the plurality of integrated circuit dies 205 to 207, based on a determination that each of the multiple dies (e.g., 205 and 207) is available to perform a data programming operation for the command.

The dynamic data placer 113 generates a portion of a media layout 130 to at least map logical addresses of the data identified in the command to the allocated pages.

The memory sub-system 110 receives the data from the host system in response to the command, after the generating of the portion of the media layout and/or after the allocation of the pages.

The memory sub-system 110 stores the data into the pages using a multi-pass programming technique, where an atomic multi-pass programming operation can use at least two pages in separate dies, or in separate planes (e.g., two planes in a single die), in the plurality of integrated circuit dies to program at least a portion of the data. For example, based on per plane page map and die availability, the data received from the host system can be mapped in a flexible way for programming across single plane, dual plane or 4-plane in a single or dual die. Single die mapping can accommodate the lowest size for a stream.

For example, the portion of the data can be programmed into the at least two pages in an atomic operation. Each of the dies is instructed to perform one write operation. Each of the dies is not instructed to perform repeated write operations for the command.

The at least two pages can include a first page in a first integrated circuit die and a second page in a second integrated circuit die. The multi-pass programming operation can include a first pass programming of the first page and a second pass programming of the second page. The first pass can be programmed in a first mode and the second pass programmed in a second mode. For example, the first mode and the second mode are different ones of: a single level cell (SLC) mode; a multi-level cell (MLC) mode; a triple level cell (TLC) mode; and a quad-level cell (QLC) mode.

For example, the allocation of the pages can be performed to minimize a mismatch between a storage capacity of the pages programmed using the multi-pass programming technique and the size of the data identified in the command.

Optionally, the pages can be allocated from a block set configured to be erased together.

For example, the dynamic data placer 113 can store a page map 305 having entries each identifying a page in a block and a memory cell programming mode (e.g., 353) for the page. The dynamic data placer 113 can allocate the pages based on the memory cell programming modes (e.g., 353) identified in the page map 305. The programming modes (e.g., 353) indicate the sizes of the available pages; and the dynamic data placer 113 allocates the pages to match the allocated storage capacity with the size of the data to be received from the host system 120.

In some implementations, a communication channel between the processing device 118 and a memory sub-system 110 includes a computer network, such as a local area network, a wireless local area network, a wireless personal area network, a cellular communications network, a broadband high-speed always-connected wireless communication connection (e.g., a current or future generation of mobile network link); and the processing device 118 and the memory sub-system can be configured to communicate with each other using data storage management and usage commands similar to those in NVMe protocol.

A memory sub-system 110 in general can have non-volatile storage media. Examples of non-volatile storage media include memory cells formed in an integrated circuit and magnetic material coated on rigid disks. Non-volatile storage media can maintain the data/information stored therein without consuming power. Memory cells can be implemented using various memory/storage technologies, such as NAND logic gate, NOR logic gate, Phase-Change Memory (PCM), Magnetic Random Access Memory (MRAM), resistive random-access memory, cross point storage and memory devices (e.g., 3D XPoint memory). A cross point memory device uses transistor-less memory elements, each of which has a memory cell and a selector that are stacked together as a column. Memory element columns are connected via two perpendicular layers of wires, where one layer is above the memory element columns and the other layer below the memory element columns. Each memory element can be individually selected at a cross point of one wire on each of the two layers. Cross point memory devices are fast and non-volatile and can be used as a unified memory pool for processing and storage.

The controller (e.g., 115) of a memory sub-system (e.g., 110) can run firmware to perform operations responsive to the communications from the processing device 118. Firmware in general is a type of computer program that provides control, monitoring and data manipulation of engineered computing devices.

Some embodiments involving the operation of the controller 115 can be implemented using computer instructions executed by the controller 115, such as the firmware of the controller 115. In some instances, hardware circuits can be used to implement at least some of the functions. The firmware can be initially stored in the non-volatile storage media, or another non-volatile device, and loaded into the volatile DRAM and/or the in-processor cache memory for execution by the controller 115.

A non-transitory computer storage medium can be used to store instructions of the firmware of a memory sub-system (e.g., 110). When the instructions are executed by the controller 115 and/or the processing device 117, the instructions cause the controller 115 and/or the processing device 117 to perform a method discussed above.

Errors can occur between storing data into memory cells and retrieving data from memory cells. To facilitate the retrieval of error free data, a memory sub-system can encode the data received from the host system using an error correcting code, such as a low-density parity-check (LDPC) code, and store the encoded data in memory cells. Decoding the encoded data retrieved from the memory cells can remove or reduce errors.

Error rate distribution is non-uniform across multiple memory pages of different programming modes and/or across wordlines in flash memory. For example, a memory sub-system can include pages programmed in an SLC (single level cell) mode, an MLC (multi-level cell) mode, a TLC (triple level cell) mode, a QLC (quad level cell) mode, etc. When configured in the SLC mode, each memory cell in a page stores one bit of data. When configured in the MLC mode, each memory cell in the page stores two bits of data. When configured in the TLC mode, each memory cell in the page stores three bits of data. When configured in the QLC mode, each memory cell in the page stores four bits of data. When the number of bits stored in a cell increases, the likelihood of errors in the data retrieved from the cell increases. A block can have most memory cells in QLC mode and some memory cells in SLC mode and/or TLC mode. When LP, MP, UP and XP pages are used to program memory cells in QLC mode using a multi-pass programming technique, the decoding of the LP page is similar to the decoding of a page in SLC mode, which has the highest signal to noise (S/N) ratio and lowest bit error rate (BER). The decoding of MP and UP pages is similar to the decoding of a page in TLC mode, which has medium S/N ratio and medium BER. The decoding of XP page is similar to the decoding of a page in QLC mode, which has the lowest S/N ratio and the highest BER. Non-uniformity of error rate distribution can lead to over design in code rate for a low-density parity-check (LDPC) code used in the memory sub-system in order to meet bit error rate requirements, especially when the technique of Redundant Array of Independent NAND (RAIN) is not used. Further, over design in code rate can result in mis-alignment between the size of sectors of host data and the memory page size, which can lead to additional wastage of memory space in the memory sub-system.

In at least some embodiments disclosed herein, a two-layer code with low parity cost is provided to address the challenge associated with the non-uniformity of error rate distribution across pages having different programming modes. For example, the two-layer code can include a first layer of LDPC code configured according to a nominal bit error rate (e.g., 0.005), instead of the worst case bit error rate (e.g., 0.01). A second layer of erasure code is configured to stride across the codewords in a multi-plane page having different programming modes (e.g., SLC, MLC, TLC, QLC) in different planes. For example, the symbol size of the erasure code used in the second layer can be 16 bytes. An iterative LDPC decode and erasure decode method can be used to decode the data retrieved from the memory cells of the multi-plane page. In the iterative method, an operation is performed to identify the location of missing symbols such that a subsequent iteration can succeed after the regeneration of symbols via the erasure decoding operation.

For example, the first layer can use a 4K LDPC with code rate of 0.9 such that the ratio between the LDPC payload size over LDPC codeword size is 0.9. The second layer can use a 63+1 (or 15+1) erasure code having a symbol size of 16 bytes such that a parity symbol can be generated for every 63 (or 15) data symbol, such that if any of the 64 (or 16) symbols is missing, the missing symbol can be recovered or calculated from the remaining 63 (or 15) symbols. The net data efficiency is the product of the code rate of the first layer and the code rate of the second layer (e.g., 0.9 times 63/64 for 63+1 erasure encoding, or 0.9 times 15/16 for 15+1 erasure encoding). The net data efficiency, as the product of the code rate of the first layer and the code rate of the second layer, can be expected to be higher than the code rate of a single, over designed LDPC code.

FIG. 7 illustrates an arrangement of a two-layer code across multiple planes.

For example, pages 501, 503, 505 and 507 can be programmed in different modes on different planes in a one or more integrated circuit dies (e.g., 205 to 207) of a memory sub-system (e.g., 110).

For example, page 501 can be in an SLC mode; page 503 can be in an MLC or TLC mode; page 505 can be in a TLC mode; and page 507 can be in a QLC mode. Optionally, the set of pages 501 to 507 can be programmed via a multi-pass programming operation across multiple planes as a multi-plane page.

In FIG. 7, each row represents a data unit of a predetermined size (e.g., 4 KB) of payload encoded using a LDPC code. For example, data symbols S1_1, S1_2 to S1_N can be encoded according to the LDPC code to generate parity data P1; data symbols S2_1, S2_2 to S2_N can be encoded according to the LDPC code to generate parity data P2; and data symbols S15_1, S15_2 to S15_N can be encoded according to the LDPC code to generate parity data P15. In general, data symbols Sm_1, Sm_2 to Sm_N can be encoded according to the LDPC code to generate parity data Pm, where m=1, 2, . . . , M. FIG. 7 illustrates an example where M=15. Data symbols Sm_1, Sm_2 to Sm_N form a data unit having a total size equal to the predetermined size (e.g., 4 KB) as the payload for the LDPC encoding.

The data symbols across the data units can be encoded using an erasure code to generate parity symbols. For example, data symbols S1_1, S2_1 to S15_1 can be encoded using a 15+1 erasure code to generate a parity symbol PS_1, such that if any of the 16 symbols S1_1, S2_1, to S15_1 and PS_1 is missing, the missing symbol can be calculated from the remaining 15 symbols. Alternatively, a 30+2 erasure code can be used to generate two parity symbols PS_1 and PS_2 from the 30 data symbols S1_1, S2_1 to S15_1 and S2_1, S2_2 to S15_2. A collection of parity symbols PS_1, PS_2 to PS_N having a total size equal to the predetermined size (e.g., 4 KB) of payload for the LDPC code can be encoded to generate the parity data labeled PPS, in a way similar to the encoding of a unit of data symbols (e.g., Sm_1, Sm_2 to Sm_N) received from the host system 120. Thus, data recovery can be performed for the parity symbols PS_1, PS_2 to PS_N using the LDPC parity data PPS according to the LDPC code.

Figure 8:
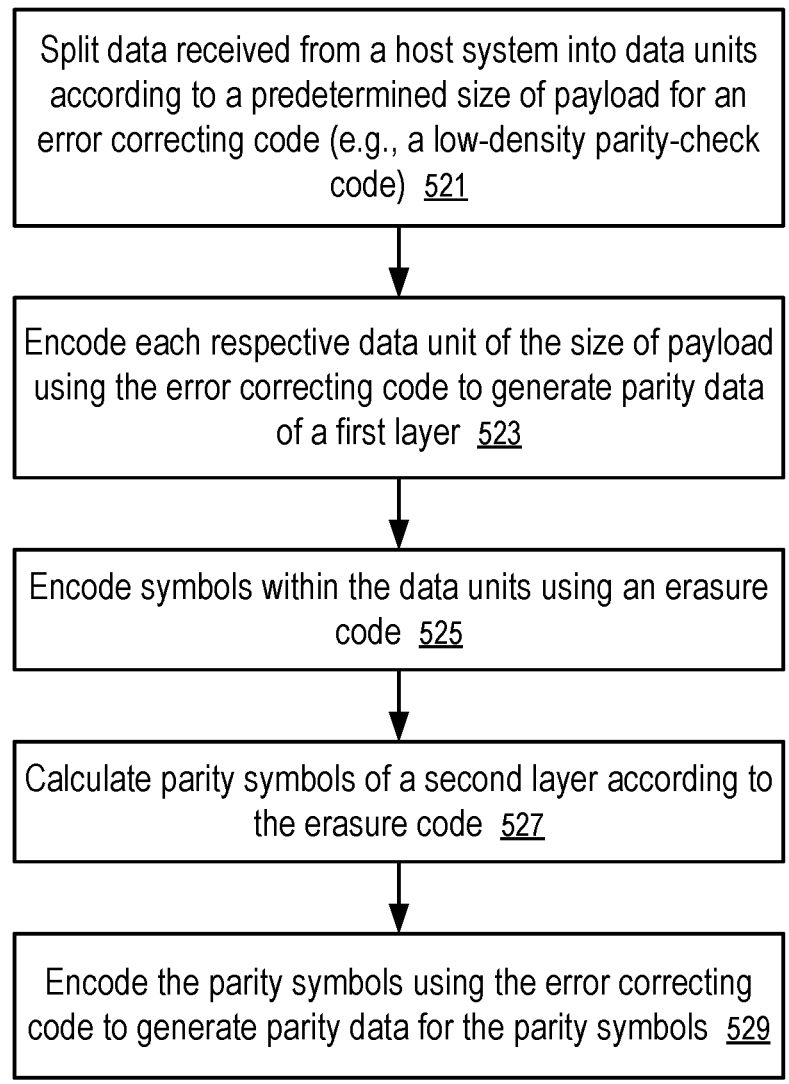
FIG. 8 illustrates a method to encode data using a two-layer code.

FIG. 8 illustrates a method to encode data using a two-layer code. The method of FIG. 8 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method of FIG. 8 is performed at least in part by the two-layer encoder/decoder 114 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

For example, the method of FIG. 8 can be performed in response to the dynamic data placer 113 allocating media units based on availability for multi-pass programming across multiple planes in one or more media units (e.g., integrated circuit dies). In some embodiments, the method of FIG. 8 can be used in a memory sub-system without the dynamic data placer 113.

At block 521, the two-layer encoder/decoder 114 splits data received from a host system into data units according to a predetermined size of payload for an error correcting code (e.g., a low-density parity-check code). For example, the data units can be each of 4 KB in size for LDPC encoding.

At block 523, the two-layer encoder/decoder 114 encode each respective data unit of the size of payload using the error correcting code to generate parity data of a first layer (e.g., P1, P2 to P15 in FIG. 7).

At block 525, the two-layer encoder/decoder 114 encodes symbols within the data units using an erasure code.

At block 527, the two-layer encoder/decoder 114 calculates parity symbols (e.g., PS_1, PS_2 to PS_N in FIG. 7) of a second layer of the two-layer code from encoding the symbols (e.g., Sm_1, Sm_2 to Sm_N in FIG. 7, where m=1, 2, . . . , 15). The erasure code allows the regeneration of a missing symbol based on a parity symbol. For example, the erasure encoding can be performed for symbols across the different pages 501 to 507 located on different planes.

At block 529, the two-layer encoder/decoder 114 encodes the parity symbols (e.g., PS_1, PS_2 to PS_N in FIG. 7) using the error correcting code to generate parity data for the parity symbols (e.g., PPS in FIG. 7).

For examples, the parity symbols can be grouped according to the predetermined size of payload for encoding using the error correcting code to generate the parity data for the parity symbols.

After the encoding using the error correcting code and the erasure code, the memory sub-system can store the symbols of the data units, the parity data of the first layer, the parity symbols, and the parity data for the parity symbols in separate planes in one or more integrated circuit dies.

For example, among the parity symbols, each respective parity symbol stored in a plane can be generated based on a portion of the symbols in the data units that is stored in a plane that does not store the respective parity symbol. For example, the portion of the symbols of the data units and the parity symbols can be stored in the separate planes using a multi-pass programming operation.

For example, the multi-pass programming operation can include a first pass programming of a first page on a first plane and a second pass programming of a second page on a second plane. The separate planes can be programmed via in different modes, such as different ones of a single level cell (SLC) mode, a multi-level cell (MLC) mode, a triple level cell (TLC) mode, and a quad-level cell (QLC) mode.

Figure 9:
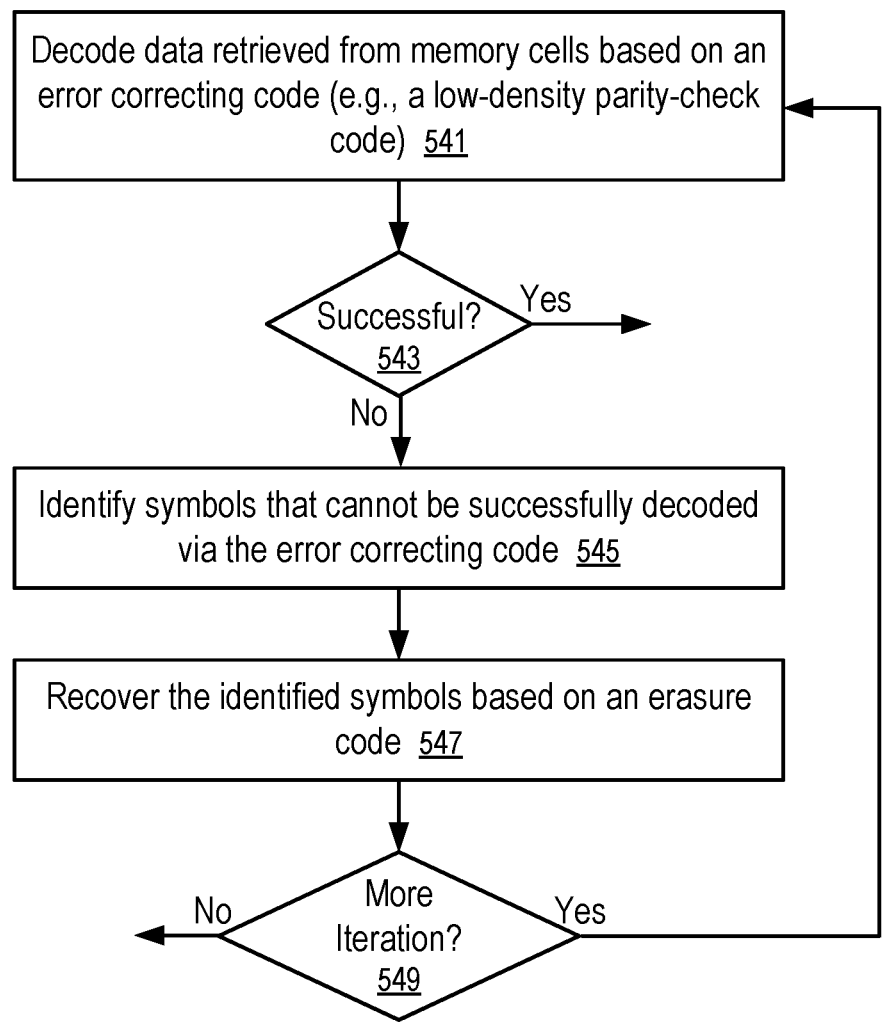
FIG. 9 illustrates a method to decode data that is encoded using a two-layer code.

FIG. 9 illustrates a method to decode data that is encoded using a two-layer code. The method of FIG. 9 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method of FIG. 9 is performed at least in part by the two-layer encoder/decoder 114 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

For example, the method of FIG. 9 can be performed to recover data encoded using the method of FIG. 8, after the encoded data is stored into memory cells using a multi-pass programming technique across multiple planes in one or more media units (e.g., integrated circuit dies) and then retrieved from the memory cells with possible errors in reading the memory cells.

At block 541, the two-layer encoder/decoder 114 decodes data retrieved from memory cells based on an error correcting code (e.g., a low-density parity-check code).

At block 543, the two-layer encoder/decoder 114 determines whether the decoding according to the error correcting code (e.g., LDPC) is successful. When all codewords generated using the error correcting code (e.g., LDPC) can be successfully decoded and/or recovered via the parity data (e.g., P1 in FIG. 7), the original data based on which the encoded data is generated, stored in and then retrieved from the memory cells is recovered successfully.

If some of the codewords cannot be successfully decoded according to the error correcting code (e.g., LDPC), at block 545, the two-layer encoder/decoder 114 identifies symbols that cannot be successfully decoded via the error correcting code. Unsatisfied parity checks in the LDPC code can be used to identify the bits in the LDPC codeword that cannot be reliably decoded. The identified symbols can be considered as missing/being erased. The erasure code can then be used to decode those few ambiguous symbols. Decoding according to the erasure code can be performed to recover the missing/erased symbols.

At block 547, the two-layer encoder/decoder 114 recovers the identified symbols based on the erasure code.

The recovered symbols can be used to replace the corresponding symbols retrieved from the memory cells and further decoded for data recovery via the error correcting code (e.g., a low-density parity-check code).

At block 549, the two-layer encoder/decoder 114 determines whether more iteration is to be performed. For example, if less than a threshold number (e.g., 4) of iterations have been performed, the two-layer encoder/decoder 114 can repeat the operations 541 to 547 for another iteration to recover data. After the threshold number (e.g., 4) of iterations have been performed and the decoding is still not successful, the two-layer encoder/decoder 114 can report a failure in data recovery/decoding.

Figure 10:
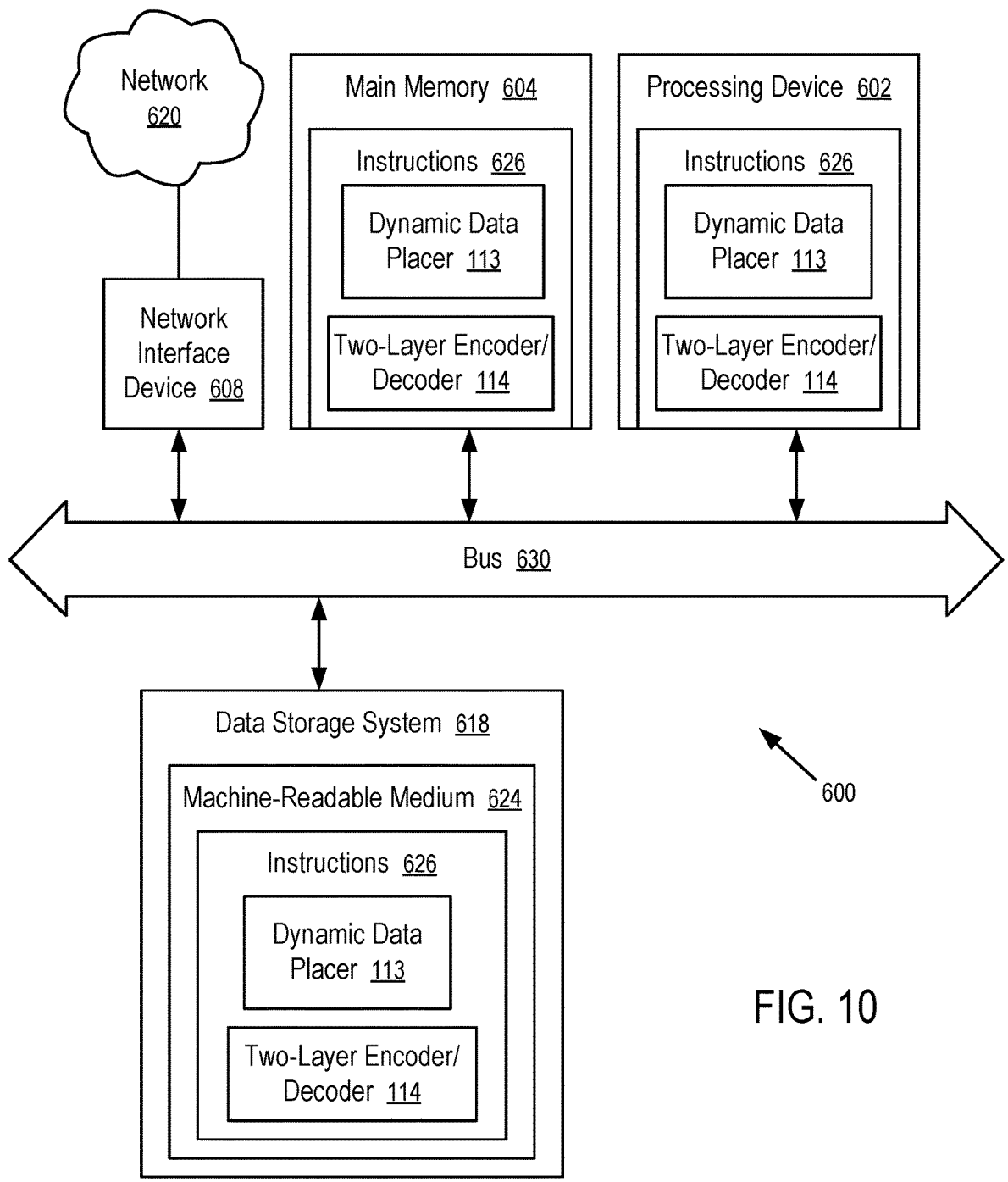
FIG. 10 is a block diagram of an example computer system in which embodiments of the present disclosure can operate.

FIG. 10 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a dynamic data placer 113 and/or a two-layer encoder/decoder 114 (e.g., to execute instructions to perform operations corresponding to the dynamic data placer 113 and/or the two-layer encoder/decoder 114 the described with reference to FIGS. 1-9). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), static random access memory (SRAM), etc.), and a data storage system 618, which communicate with each other via a bus 630 (which can include multiple buses).

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a dynamic data placer 113 and/or a two-layer encoder/decoder 114 (e.g., the dynamic data placer 113 and/or the two-layer encoder/decoder 114 described with reference to FIGS. 1-9). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In this description, various functions and operations are described as being performed by or caused by computer instructions to simplify description. However, those skilled in the art will recognize what is meant by such expressions is that the functions result from execution of the computer instructions by one or more controllers or processors, such as a microprocessor. Alternatively, or in combination, the functions and operations can be implemented using special purpose circuitry, with or without software instructions, such as using Application-Specific Integrated Circuit (ASIC) or Field-Programmable Gate Array (FPGA). Embodiments can be implemented using hardwired circuitry without software instructions, or in combination with software instructions. Thus, the techniques are limited neither to any specific combination of hardware circuitry and software, nor to any particular source for the instructions executed by the data processing system.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. An apparatus, comprising:
an interface;
memory cells formed on at least one integrated circuit die; and
a logic circuit configured to, in response to the interface receiving a request to write, to the apparatus, first data:
generate a plurality of codewords representative of the first data according to an error correction technique, wherein each codeword among the plurality of codewords is decodable to recover a separate unit in the first data;
calculate parity symbols according to an erasure code;
generate parity data of the parity symbols using the error correction technique; and
store second data, representative of the first data with redundant information, in separate planes in one or more integrated circuit dies.

2. The apparatus of claim 1, wherein, in response to the request, the logic circuit is further configured to:
split the first data into a plurality of units, wherein the plurality of codewords are decodable to recover the plurality of units respectively.

3. The apparatus of claim 2, wherein each of the plurality of units has a same predetermined size.

4. The apparatus of claim 2, wherein the logic circuit is further configured to:
encode symbols within the plurality of units using the erasure code to calculate the parity symbols.

5. The apparatus of claim 4, wherein the error correction technique is based on a low-density parity-check (LDPC) code.

6. The apparatus of claim 5, wherein the parity symbols are grouped according to a predetermined size of payload for encoding using the error correction technique to generate the parity data of the parity symbols.

7. The apparatus of claim 5, wherein among the parity symbols, each respective parity symbol stored in a plane is generated based on a portion of the symbols within the plurality of units, stored in a plane that does not store the respective parity symbol.

8. The apparatus of claim 7, wherein the portion of the symbols within the plurality of units and the parity symbols are stored in the separate planes using a multi-pass programming operation.

9. The apparatus of claim 8, wherein the multi-pass programming operation includes a first pass programming of a first page on a first plane and a second pass programming of a second page on a second plane.

10. The apparatus of claim 8, wherein the separate planes are programmed via in different modes.

11. The apparatus of claim 10, wherein the different modes include a first mode and a second mode; and the first mode and the second mode are different ones of:
a single level cell (SLC) mode;
a multi- level cell (MLC) mode;
a triple level cell (TLC) mode; and
a quad-level cell (QLC) mode.

12. A method, comprising:
receiving, in an interface of an apparatus, a request to write, to memory cells in the apparatus, first data;
generating a plurality of codewords representative of the first data according to an error correction technique, wherein each codeword among the plurality of codewords is decodable to recover a separate unit in the first data;
calculating parity symbols according to an erasure code; and
generating parity data of the parity symbols using the error correction technique;
wherein the parity symbols are grouped according to a predetermined size of payload for encoding using the error correction technique to generate the parity data of the parity symbols.

13. The method of claim 12, further comprising:
splitting the first data into a plurality of units, wherein the plurality of codewords are decodable to recover the plurality of units respectively, wherein each of the plurality of units has a same predetermined size.

14. The method of claim 13, further comprising:
encoding symbols within the plurality of units using the erasure code to calculate the parity symbols.

15. The method of claim 14, wherein the error correction technique is based on a low-density parity-check (LDPC) code.

16. The method of claim 14, further comprising:
storing second data, representative of the first data with redundant information, in separate planes in one or more integrated circuit dies.

17. The method of claim 16, wherein among the parity symbols, each respective parity symbol stored in a plane is generated based on a portion of the symbols within the plurality of units, stored in a plane that does not store the respective parity symbol; the portion of the symbols within the plurality of units and the parity symbols are stored in the separate planes using a multi-pass programming operation; the multi-pass programming operation includes a first pass programming of a first page on a first plane and a second pass programming of a second page on a second plane; and the separate planes are programmed via in different modes.

18. A non-transitory computer storage medium storing instructions which, when executed in a memory sub-system, causes the memory sub-system to perform a method, the method comprising:
receiving, in an interface of an apparatus, a request to write, to memory cells in the apparatus, first data;
generating a plurality of codewords representative of the first data according to an error correction technique, wherein each codeword among the plurality of codewords is decodable to recover a separate unit in the first data;
calculating parity symbols according to an erasure code;
generating parity data of the parity symbols using the error correction technique; and
storing second data, representative of the first data with redundant information, in separate planes in one or more integrated circuit dies.

19. The non-transitory computer storage medium of claim 18, wherein the method further comprises:
splitting the first data into a plurality of units, wherein the plurality of codewords are decodable to recover the plurality of units respectively; and
encoding symbols within the plurality of units using the erasure code to calculate the parity symbols.

20. The non-transitory computer storage medium of claim 18, wherein the parity symbols are grouped according to a predetermined size of payload for encoding using the error correction technique to generate the parity data of the parity symbols.

* * * * *